(12) United States Patent
Laureanti et al.

(10) Patent No.: US 6,304,145 B1
(45) Date of Patent: Oct. 16, 2001

(54) LARGE SIGNAL AMPLIFIER GAIN COMPENSATION CIRCUIT

(75) Inventors: Steven J. Laureanti, Lewisville; Mikko Nieminen, Irving, both of TX (US)

(73) Assignee: Nokia Networks Oy, Espoo (FI)

( * ) Notice: Subject to any disclaimer, the term of this patent is extended or adjusted under 35 U.S.C. 154(b) by 0 days.

(21) Appl. No.: 09/496,622

(22) Filed: Feb. 2, 2000

(51) Int. Cl.[7] .................................................. H03G 3/10
(52) U.S. Cl. ........................ 330/285; 330/132; 330/136
(58) Field of Search .................................. 330/132, 136, 330/285

(56) References Cited

U.S. PATENT DOCUMENTS

| | | | |
|---|---|---|---|
| 3,969,680 | * | 7/1976 | Wermuth .................................. 330/29 |
| 3,980,964 | * | 9/1976 | Grodinsky ................................ 330/29 |
| 4,220,929 | * | 9/1980 | Talbot et al. ........................... 330/136 |
| 5,923,215 | * | 7/1999 | Hans ....................................... 330/149 |

* cited by examiner

Primary Examiner—Robert Pascal
Assistant Examiner—Henry Choe
(74) Attorney, Agent, or Firm—Banner & Witcoff, Ltd.; Brooke Hayes, Esq.

(57) ABSTRACT

A power amplifier to process an input signal includes an amplifying device operating at a quiescent point and a bias network that varies the quiescent point according to a frequency of the input signal. In a variant of this power amplifier, the bias network includes a compensation circuit to provide a bias signal that varies according to a frequency of the input signal and a bias circuit to vary the quiescent point according to the bias signal. In an alternative embodiment of the invention, a method of making a power amplifier includes steps of measuring a gain performance of an amplifying device at a plurality of frequencies, determining a desired quiescent point of the amplifying device at each frequency of the plurality of frequencies, and constructing a bias network that varies an operating quiescent point of the amplifying device according to a frequency of the input signal so that the operating quiescent point approximates the desired quiescent point at each frequency of the plurality of frequencies. In a variant of this method the step of determining determines the desired quiescent point to be an operating quiescent point at which the amplifying device dissipates a minimum power that is consistent with providing a gain performance within a specified range of gains.

14 Claims, 11 Drawing Sheets

REPRESENTATIVE GAW PERFORMANCE OF PRIOR ART

REPRESENTATIVE GAIN PERFORMANCE OF PRIOR ART

LARGE SIGNAL AMPLIFIER GAIN COMPENSATION CIRCUIT

BACKGROUND OF THE INVENTION

1. Field of the Invention

The present invention relates to transistor power amplifiers as may be used in, for example, a cell phone base station. In particular, the invention relates to a method and circuit for biasing the amplifier based on a frequency of an amplified signal to improve flatness and expansion properties of the amplifier's gain performance.

2. Description of Related Art

FIG. 10, a known power amplifier includes amplifying device Q1, an input matching (and biasing) network formed from capacitor $C_1$ and inductor $L_1$ and an output matching network formed from capacitor $C_2$ and inductor $L_2$. At lower frequencies, the input matching network and the output matching network are typically formed from discrete components. At higher frequencies (e.g., greater than 1,000 MHz), the input matching network and the output matching network are often formed from distributed capacitances, inductances and resistances as may be found in stripline, microstrip or similar circuits. Amplifying device Q1 is shown as an NPN transistor, but might also be a PNP transistor, an MOS transistor, or similar RF transistor. The amplifying device of FIG. 10 might also be a pair of matched transistors arranged in a balanced push pull circuit with appropriate couplers and matching circuits on the input and output.

The inherent resistance of inductor $L_2$ combined with supply voltage $V_{CC}$ defines the slope and $V_C$ axis intercept of load line LL shown in FIG. 11. In general, the slope and $V_C$ axis intercept of load line LL is defined by the supply voltage and the total resistance between the collector and the supply voltage whether the resistance is produced by a discrete resistor, distributed resistance or inherent resistance of other components such as inductors. FIG. 11 depicts a graph of collector current $I_C$ as a function of voltage $V_C$ on the collector of transistor Q1, and the quiescent operating point of transistor Q1 is defined by a point on load line LL. For example, point A represents a quiescent operating point when voltage $V_3$ is applied to the base of transistor Q1. In fact, FIG. 11 depicts six such transistor operating curves for base voltages from $V_1$ through $V_6$. Quiescent point A is achieved by setting bias voltage $V_{BIAS}$ to voltage $V_3$ plus a small voltage drop that may occur across the inherent resistance of inductor $L_1$ resulting from the direct (i.e., steady state) current into the base of transistor Q1.

Selection of quiescent point A creates a class A amplifier for input signal $E_I$ applied to the base of transistor Q1. In a class A amplifier, input signal $E_I$ applied to the base of transistor Q1 varies above and below the base bias voltage of $V_3$. This momentarily deviates the transistor operating point above and below quiescent point A in a sinusoidal rhythm as depicted in FIG. 11. The voltage on the collector of transistor Q1 also varies sinusoidally and can be read off of the $V_C$ axis at the deviated transistor operating point. In a class A amplifier, the output signal waveform is a faithful reproduction with gain of the input signal waveform with little distortion (e.g., third harmonic distortion). However, if a class A amplfier is over driven by input signal $E_I$, the amplifier can be driven into class AB operation. In a class A amplifier, transistor Q1 constantly dissipates power (i.e., $V_C I_C$) when operating at quiescent point A. This produces undesired heating of transistor Q1, a resulting undesired increase in an equivalent base spreading resistance, and a consequent reduction in the gain performance of the transistor at the high end of the frequency range.

Selection of quiescent point B creates a class B amplifier. In a class B amplifier, transistor Q1 is biased so that the quiescent current through transistor Q1 is zero. At such a bias point, transistor Q1 acts as a half wave rectifier. Only half of the sinusoidal waveform of input signal $E_I$ applied to the base of a class B amplifier actually appears on the collector of transistor Q1 (i.e., the output). The other half is "clipped". This produces significant distortion, particularly third harmonic distortion. However, in a class B amplifier, transistor Q1 dissipates no steady state power (i.e., $V_C I_C$) when operating at quiescent point B since collector current $I_C$ is zero.

Selection of quiescent point AB creates a class AB amplifier. In a class AB amplifier, the exact quiescent point AB can be selected by design requirements so as to limit the occurrence of third harmonic distortion to no more than that permitted by the system design requirements while at the same time minimizing the power dissipated in transistor Q1 consistent with the third harmonic distortion requirement. FIG. 11 depicts an output signal waveform with collector voltages varying about quiescent point AB where only a small portion of the waveform is "clipped", thus resulting in less distortion than would occur with a class B operation. Most large signal amplifiers designed for the cell phone industry use a class AB amplifier, in one form or another, because of the flexibility of the design to meet system distortion requirements while minimizing the dissipated power. It should be noted that a transistor biased to operate at quiescent point AB will operate as a class A amplifier if input signal $E_I$ is sufficiently small.

The distortion present in a large signal amplifier depends on how large the signal is. It is convenient, to measure the largeness of the signal as the signal power at the collector of transistor Q1, although other measures may be used. The signal power is the RMS (root mean squared) value of the alternating portion of the output signal, not the steady state power dissipated at the quiescent operating point. The output signal power passes through capacitor $C_2$. The output signal power is also defined by input signal power multiplied by the power gain of transistor Q1.

FIG. 12 depicts a representative gain performance (e.g., power gain, but could be voltage gain or current gain) of the amplifier of FIG. 10. The amplifier gain varies between a minimum gain and a maximum gain when the operating frequency varies over a range of frequencies. To characterize the gain distribution, a gain flatness is defined to be one-half of the sum of the minimum gain plus the maximum gain.

FIG. 13 depicts the gain of a power amplifier with a collector current of transistor Q1 biased to be 70 milliamperes at three discrete frequencies (1,800 MHz and 1,840 MHz and 1,880 MHz) over a dynamic range of output signal powers that varies from 18.79 dBm to 37.71 dBm. Zero dBm is one milliwatt, and other output signal powers are expressed in dBm (i.e., decibels relative to one milliwatt). FIG. 13 illustrates gain expansion. At 1,800 MHz, the amplifier power gain varies from a little over 20 dB when the output signal power is set at 19 dBm to a maximum of 21 dB at an output signal power near 32 dBm and then drops to less than 17 dB at an output signal power near 37 dBm. A slightly different gain expansion can be observed in FIG. 13 for signal frequencies of 1,840 MHz and 1,880 MHz. FIG. 13 depicts that the amplifier gain measured over the three frequencies varies 2.5 dB (a measure of flatness) when operated with a signal providing a 23 dBm output signal power and varies 2.8 dB when operated with a signal providing a 32 dBm output signal power. This variation of the amplifier gain with increasing output signal power from the amplifier is referred to as a gain expansion. The gain even falls below 18 dB at the low frequency of 1,800 MHz.

SUMMARY OF THE INVENTION

It is an object of the present invention to provide a power amplifier that has reduced gain variation over variations in operating frequency and variations in output signal power. It is a further object of the present invention to provide a method of making such an amplifier.

These and other objects are achieved in a power amplifier to process an input signal that includes an amplifying device operating at a quiescent point and a bias network that varies the quiescent point according to a frequency of the input signal. In a variant of this power amplifier, the bias network includes a compensation circuit to provide a bias signal that varies according to a frequency of the input signal and a bias circuit to vary the quiescent point according to the bias signal.

In an alternative embodiment of the invention, a method of making a power amplifier includes steps of measuring a gain performance of an amplifying device at a plurality of frequencies, determining a desired quiescent point of the amplifying device at each frequency of the plurality of frequencies, and constructing a bias network that varies an operating quiescent point of the amplifying device according to a frequency of the input signal so that the operating quiescent point approximates the desired quiescent point at each frequency of the plurality of frequencies. In a variant of this method the step of determining determines the desired quiescent point to be an operating quiescent point at which the amplifying device dissipates a minimum power that is consistent with providing a gain performance within a specified range of gains.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

Figure 1:
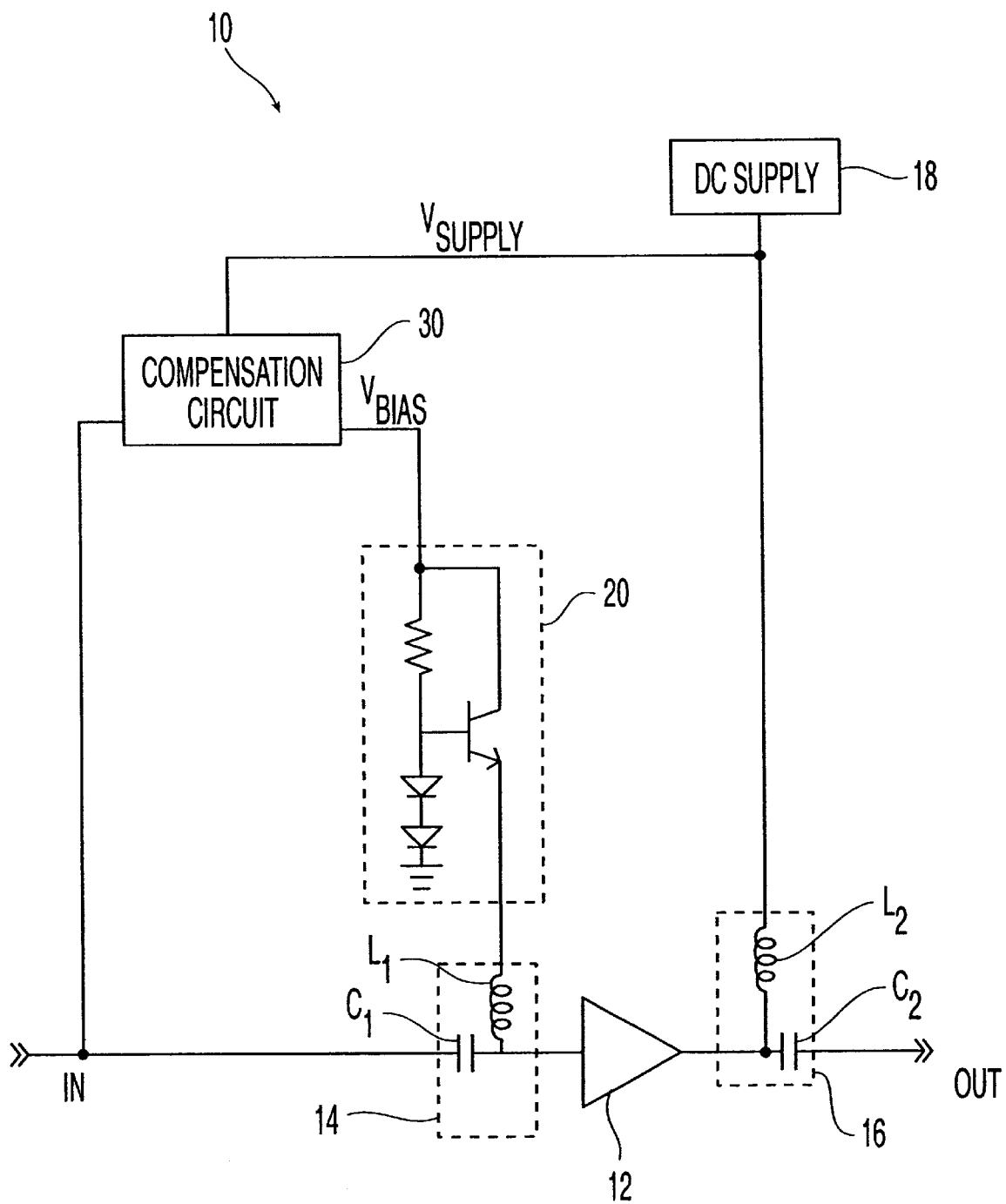
FIG. 1 is a functional block diagram of an amplifier according to the present invention.

In FIG. 1, power amplifier 10 includes amplifying device 12, input matching network 14, output matching network 16, dc supply 18 and a bias network constituted by bias circuit 20 and compensation circuit 30. Input matching network 14 matches the impedance between the line carrying input signal IN and amplifying device 12 and also couples to bias circuit 20 to provide the desired quiescent operating point. Output matching network 16 matches the impedance between the line carrying output signal OUT and amplifying device 12 and also couples to dc supply 18 to power the amplifying device. Amplifying device 12 may be any of an NPN transistor, a PNP transistor, a MOS transistor, another type of RF transistor or a matched transistor pair configured in a balanced or push pull circuit.

The present inventors discovered that gain flatness is effected by both the choice of matching network circuitry and the choice of the quiescent operating point, and that gain expansion is effected by the choice of quiescent operating point.

Figure 2:
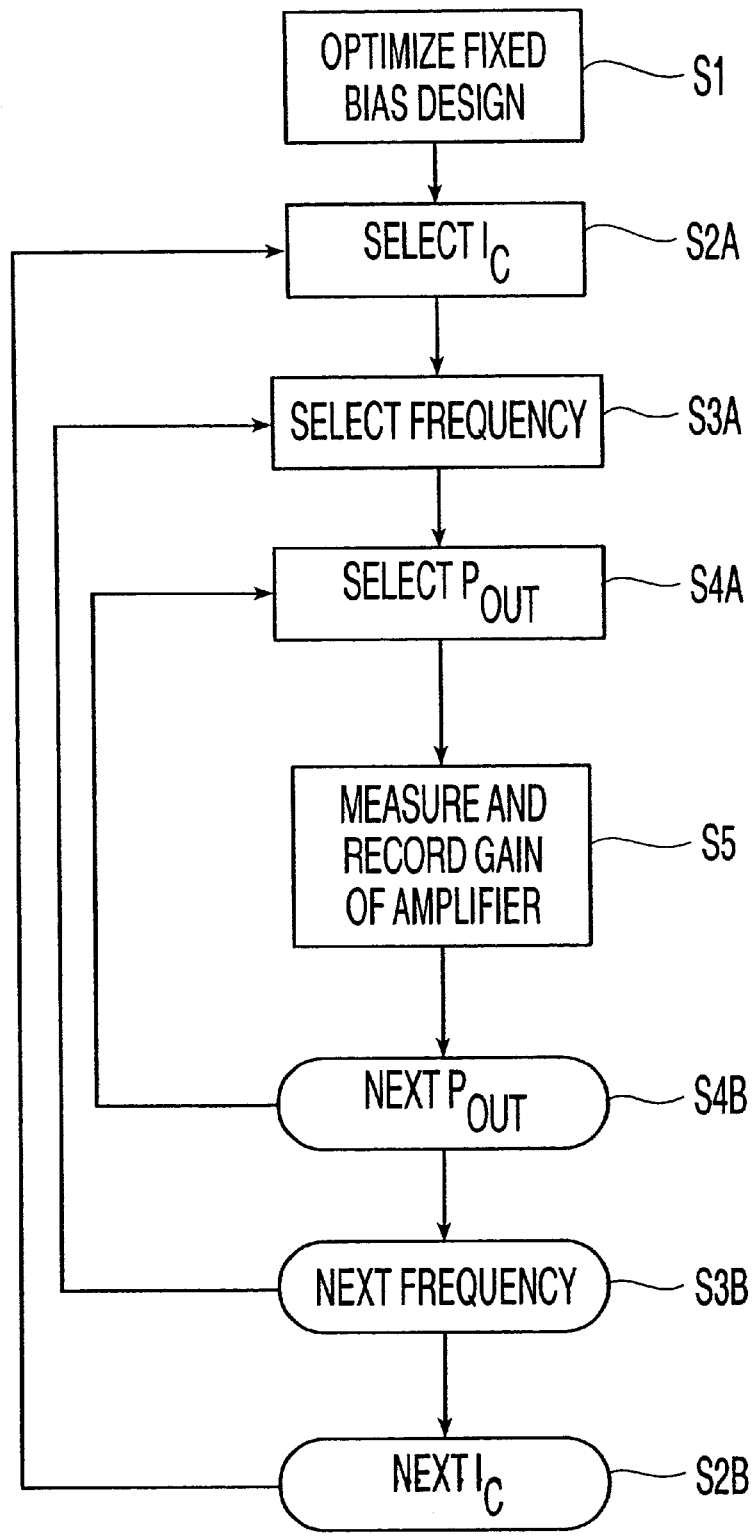
FIG. 2 is a flow chart of a measurement process according to the present invention.

The amplifier gain of amplifying device 12 is measured over a range of frequencies, output signal powers and quiescent operating points by the process depicted in FIG. 2. In FIG. 2, a process of measuring a gain performance of the amplifying device at a plurality of frequencies includes generating an initial design at step S1 then repeatedly measuring the gain of the amplifying device and recording the measured gain of an amplifying device in step S5 under varying conditions controlled by steps S2A, S3A and S4A and S2B, S3B and S4B. Steps S4A and S4B cause step S5 to be repeated at each output power level selected from a plurality of output power levels. Steps S3A and S3B cause steps S4A, S4B and S5 to be repeated at each frequency selected from a plurality of frequencies over the frequency range. Steps S2A and S2B cause steps S3A, S3B, S4A, S4B and S5 to be repeated at each quiescent point selected from a plurality of quiescent points. However, the order of these repeating loops may be varied.

Figure 3:
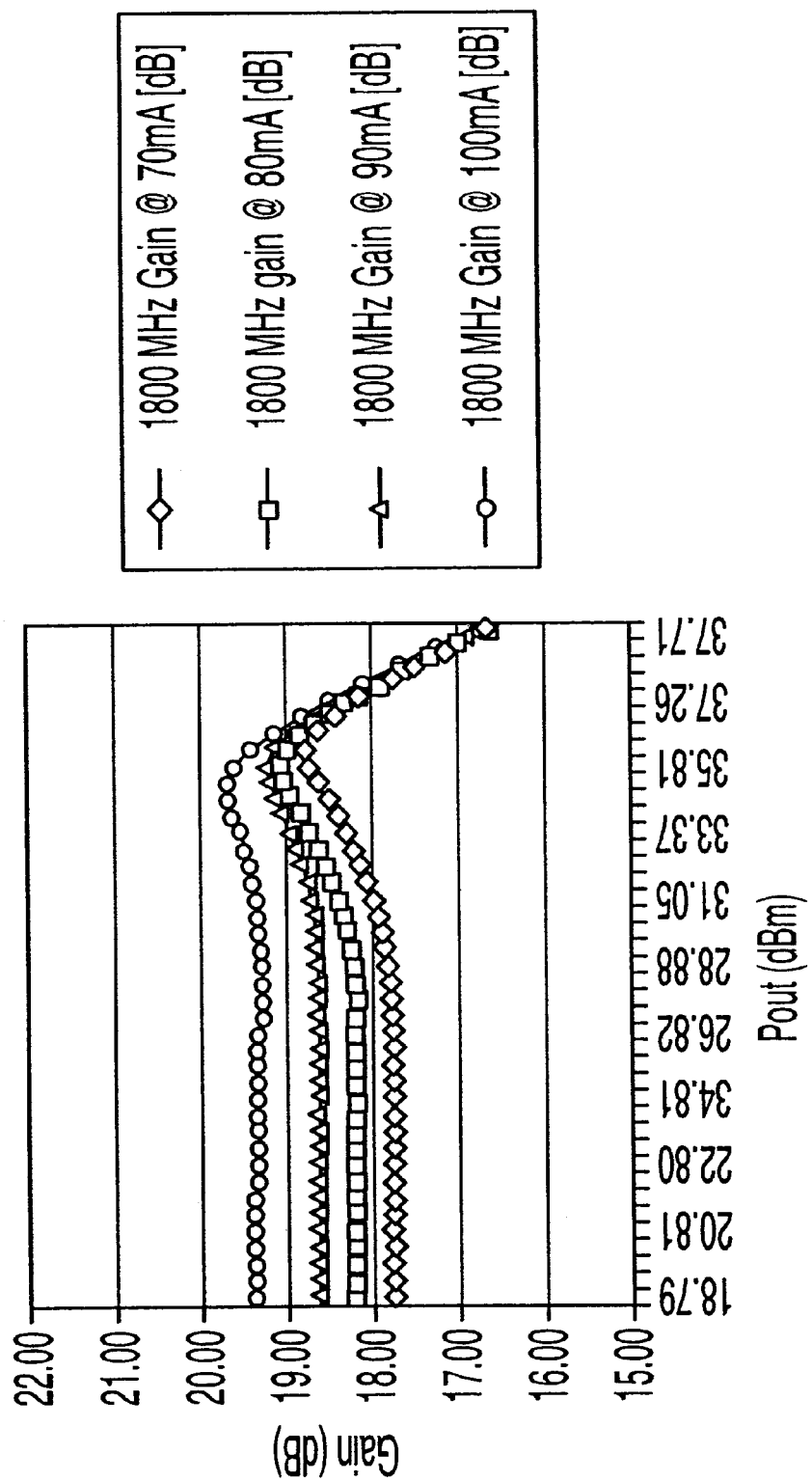
FIG. 3 is a graph that plots representative data collected according to the process of FIG. 2.

In FIG. 3, the result of such a measurement process at a 1,800 MHz frequency is depicted where the output signal power is driven to vary (i.e., swept) from 18 dBm to 37 dBm. A measured plot is depicted for each collector biasing current from 70 dBm to 100 dBm at 10 dBm intervals. It can be seen that by increasing the collector current (toward class A operation), the power amplifier gain can be increased.

Figure 13:
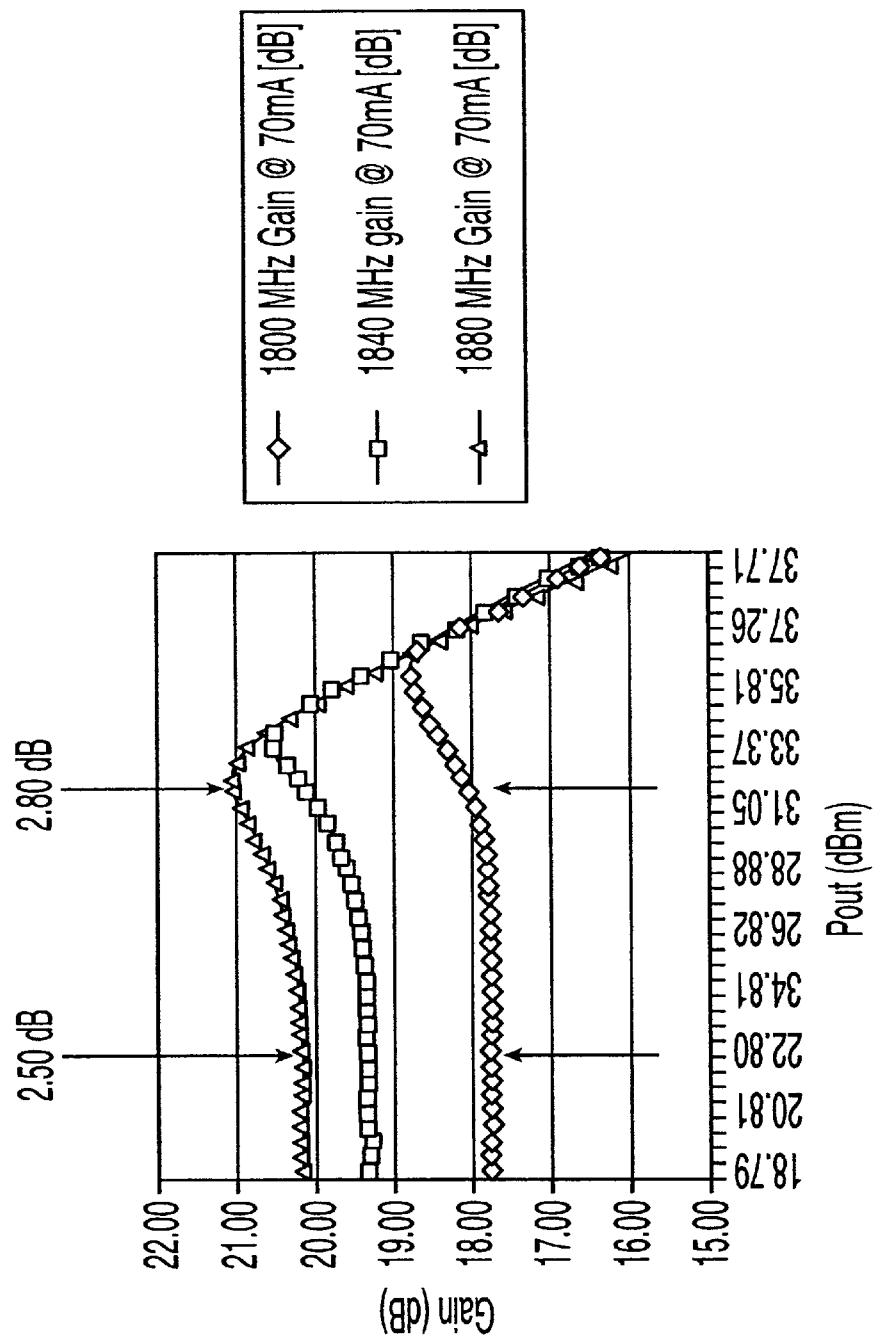
FIG. 13 is a graph that plots representative data collected about a known amplifier.

It is now possible to increase the amplifier gain at 1,880 MHz (as depicted in FIG. 13) by increasing the collector current through the amplifying device at the quiescent point. In fact, increasing the collector current with increasing frequency will improve the gain flatness of the amplifying device.

Figure 4:
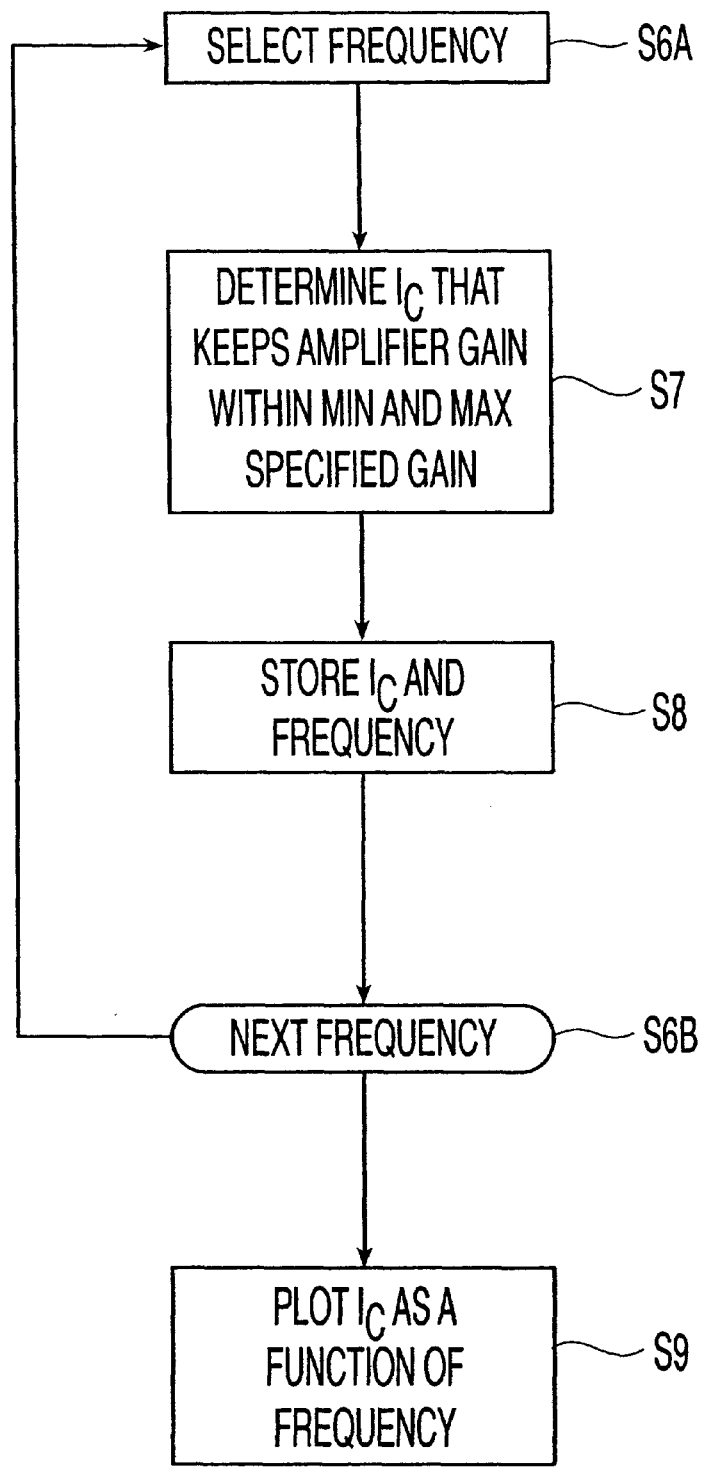
FIG. 4 is a flow chart of a determining process according to the present invention.

In FIG. 4, a process to determine a desired quiescent point of the amplifying device at each frequency of a plurality of frequencies includes steps S7, S8 and steps S6A and S6B for repeating steps S7 and S8 for each frequency of the plurality of frequencies. In step S7, a desired quiescent point (e.g., collector current $I_C$) for the selected frequency is determined by selecting a point from the measured data set collected by the process of FIG. 2. The desired quiescent point must cause the amplifier gain to be between the minimum and maximum specification at the selected frequency, and the quiescent point must cause the amplifier to exhibit no more distortion (e.g., third harmonic distortion) than is permitted by the system's specifications. If more than one collector current biases an amplifying device to meet all system requirements, then the one that dissipates the least power (e.g., lowest $I_C$) is selected. If no collector current biases an amplifying device to meet all system requirements, then other known design tradeoff processes are used to abate one of the system requirements (e.g., lower the gain requirement or change amplifying devices). Then, in step S8, the selected quiescent point (e.g., collector current $I_C$) is stored for each selected frequency.

Figure 5:
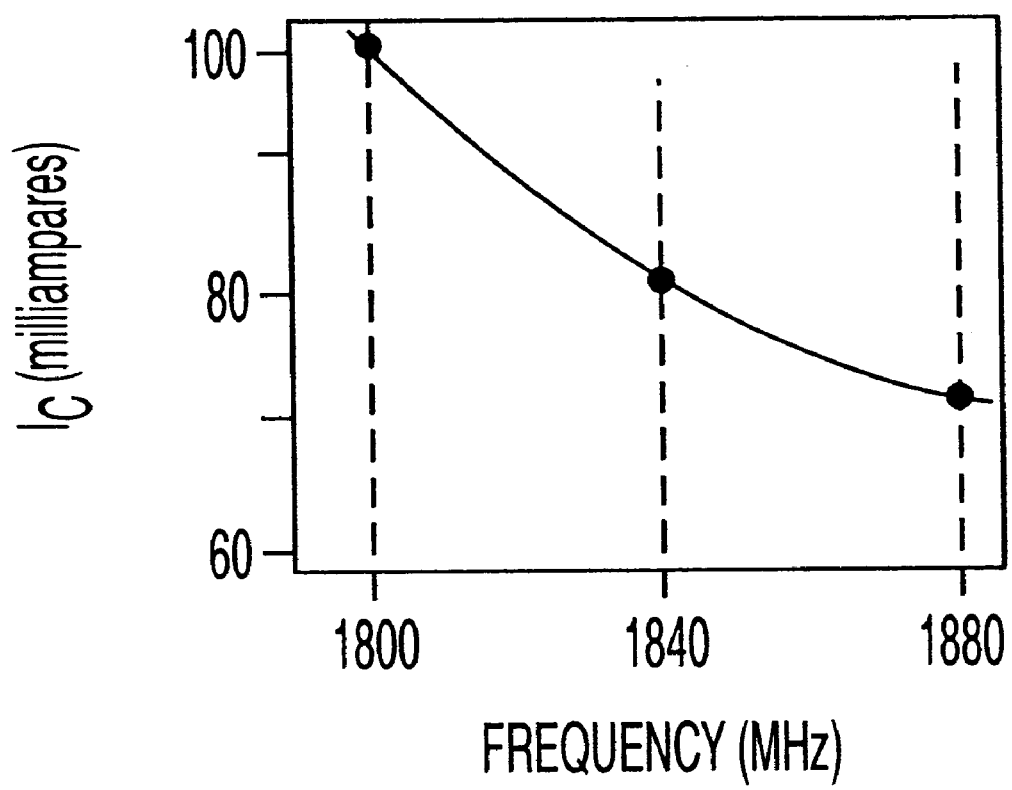
FIG. 5 is a graph that plots representative data collected according to the process of FIG. 4.

In step S9, a plot is made (FIG. 5) of the selected quiescent point (e.g., collector current $I_c$) as a function of frequency. In FIG. 5, the selected quiescent point (e.g., collector current $I_C$) is 100 mA, 80 mA and 70 mA for respective frequencies 1,800 MHz, 1,840 MHz and 1,880 MHz. These frequency dependent collector currents were incorporated in a design of the bias network of FIG. 1, and gain measurements were again performed according to the process of FIG. 2, and the results are plotted in the graph of FIG. 6. As can be seen, the minimum amplifier gain has been increased (with respect to FIG. 13) from just below 18 dB to just above 19 dB, gain flatness has improved from 2.5 dB to 0.9 dB when the output signal power is about 23 dBm, and gain flatness has improved from 2.8 dB to 1.5 dB when the output signal power is about 32 dBm.

Figure 7:
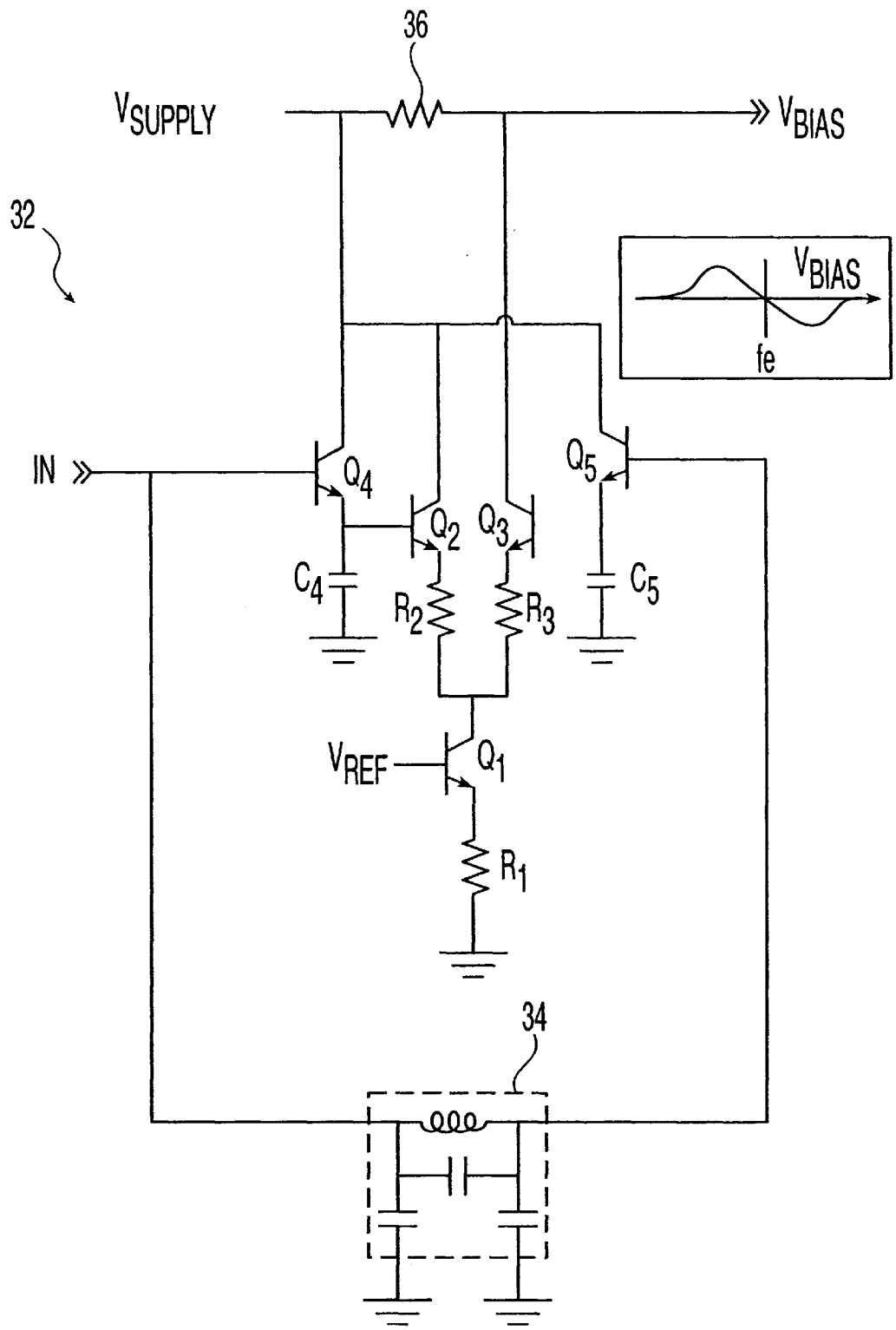
FIG. 7 is a circuit schematic of a known frequency discrimination circuit as may be used on TV sound receivers.

In FIG. 7, a known frequency discrimination circuit is based on differential peak detector 32 as may be used on a TV sound FM detector such as RCA's CA3065 integrated circuit. Circuit 32 includes first peak detection circuit comprised of transistor $Q_4$ and capacitor $C_4$, phase shifting circuit 34 and second peak detection circuit comprised of transistor $Q_5$ and capacitor $C_5$. The first and second detected peaks are differentially detected in the comparison circuit that includes transistor $Q_1$ and resistor $R_1$, transistor $Q_2$ and resistor $R_2$, transistor $Q_3$ and resistor $R_3$, and resistor 36. The slope of the $V_{BIAS}$ output is controlled by the ratio of the resistance of resistor $R_2$ to the resistance of resistor $R_3$, and the $f_0$ reference point is controlled by phase shifting circuit 34.

Figure 8:
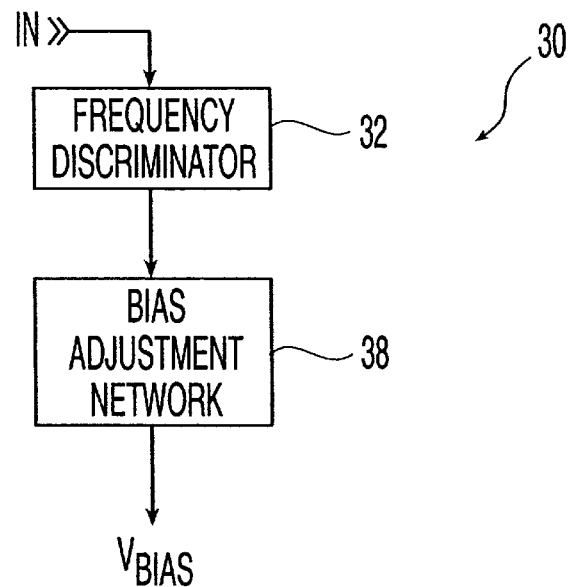
FIG. 8 is a functional schematic of an embodiment of a compensation circuit of FIG. 1 that uses a frequency discrimination circuit as depicted in FIG. 7.

However, if the $V_{BIAS}$ produced by the circuit of FIG. 7 does not match the power amplifier needs as plotted in FIG. 5 as closely as required by system specifications, a bias adjusting network may be appended. In FIG. 8, compensation circuit 30 includes known frequency discrimination circuit 32 (FIG. 7) and bias adjusting network 38 to produce the needed $V_{BIAS}$ signal out of circuit 30. Bias adjusting network 38 may include any number of network topologies with active and/or passive non-linear elements (diodes and transistors) to provide a $V_{BIAS}$ that can control the power amplifier quiescent point with a collector current as plotted in FIG. 5 or as closely thereto as required by the system specification.

Figure 9:
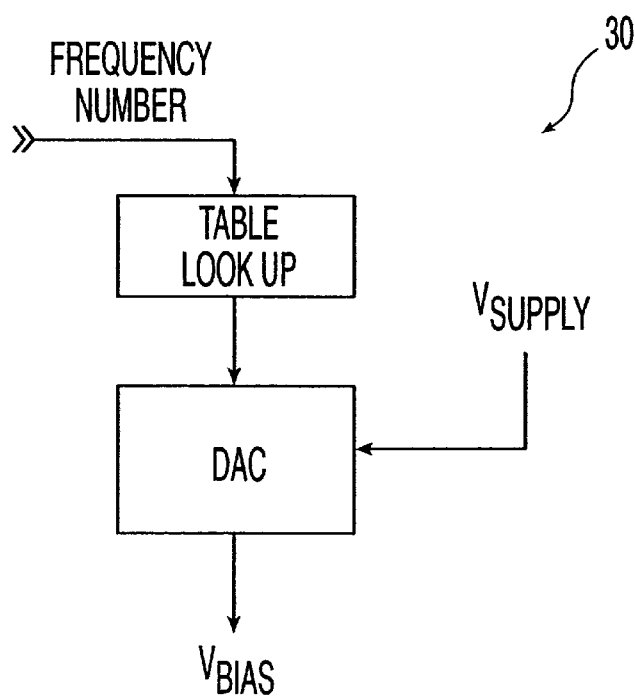
FIG. 9 is a functional schematic of a digital embodiment of a compensation circuit of FIG. 1.
Figure 10:
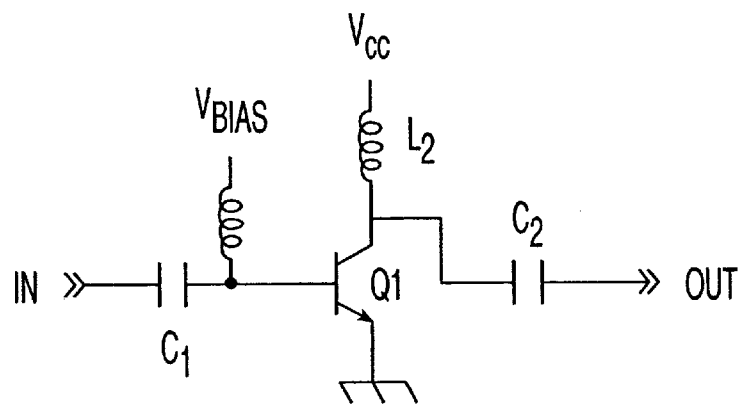
FIG. 10 is a circuit schematic of a known large signal amplifier.
Figure 11:
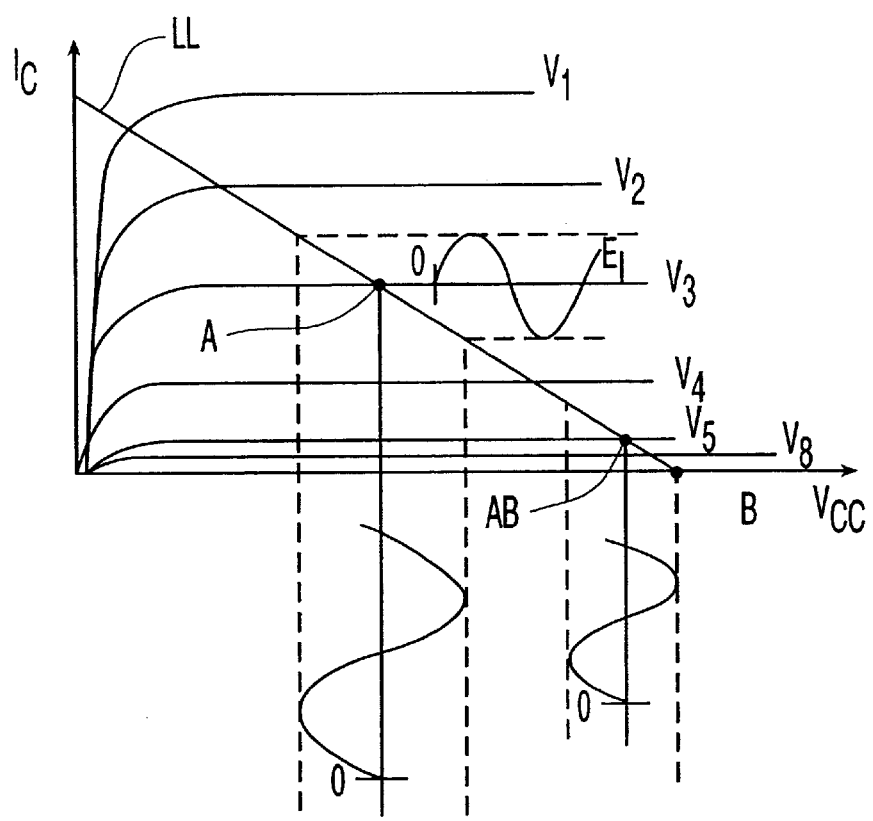
FIG. 11 is a graph of transistor operating characteristics of the transistor in the amplifier of FIG. 10.
Figure 12:
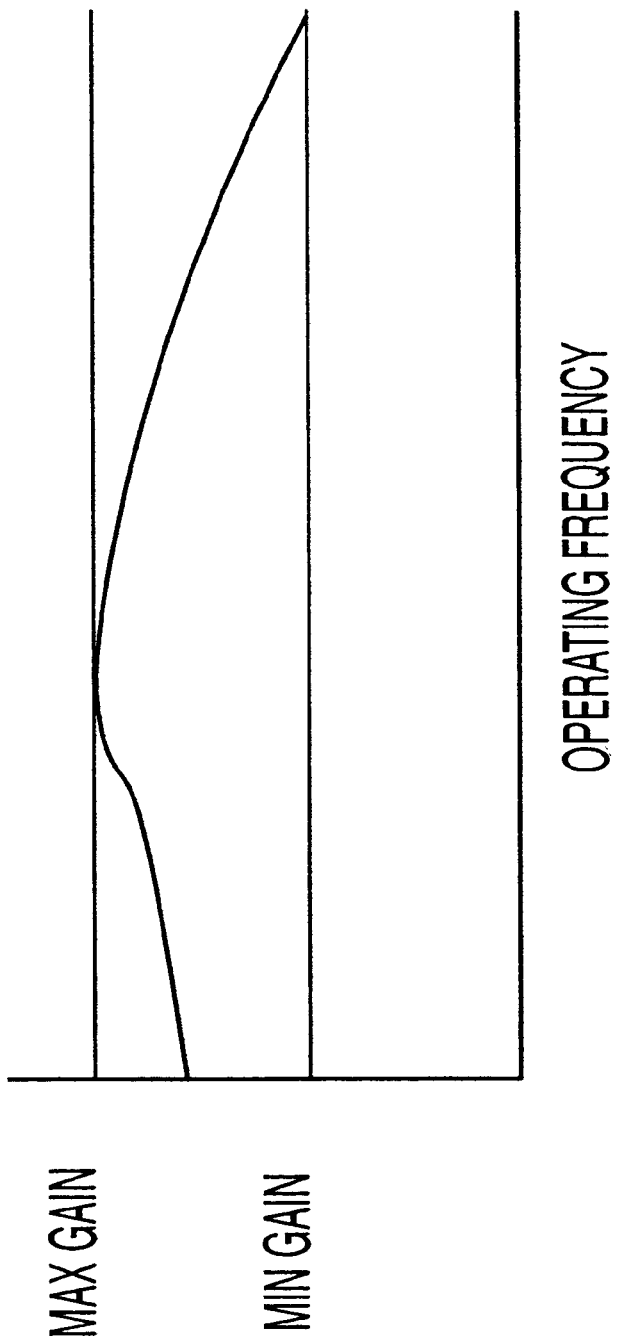
FIG. 12 is a graph illustrating gain performance as may be experienced by known amplifiers.

Alternatively, in FIG. 9, compensation circuit 30 (as depicted in FIG. 1) includes a table look up memory (e.g., a read only memory or ROM) and a digital to analog converter to produce the required $V_{BIAS}$ signal. An application specific integrated circuit (ASIC) or a portion thereof might be used to construct compensation circuit 30 as depicted in FIG. 9. In operation, a digital frequency number representing the frequency is received from, for example, a frequency synthesizer of a cell phone base station transmitter. The digital frequency number is used as an address to select a predefined digitally represented quiescent current stored in the look up table of FIG. 9, the quiescent current corresponding to the frequency represented by the frequency number. The digitally represented quiescent current stored in the look up table of FIG. 9 for each frequency produces the $V_{BIAS}$ current that will produce the quiescent current depicted in FIG. 5 in amplifying device 12 (FIG. 1).

Figure 6:
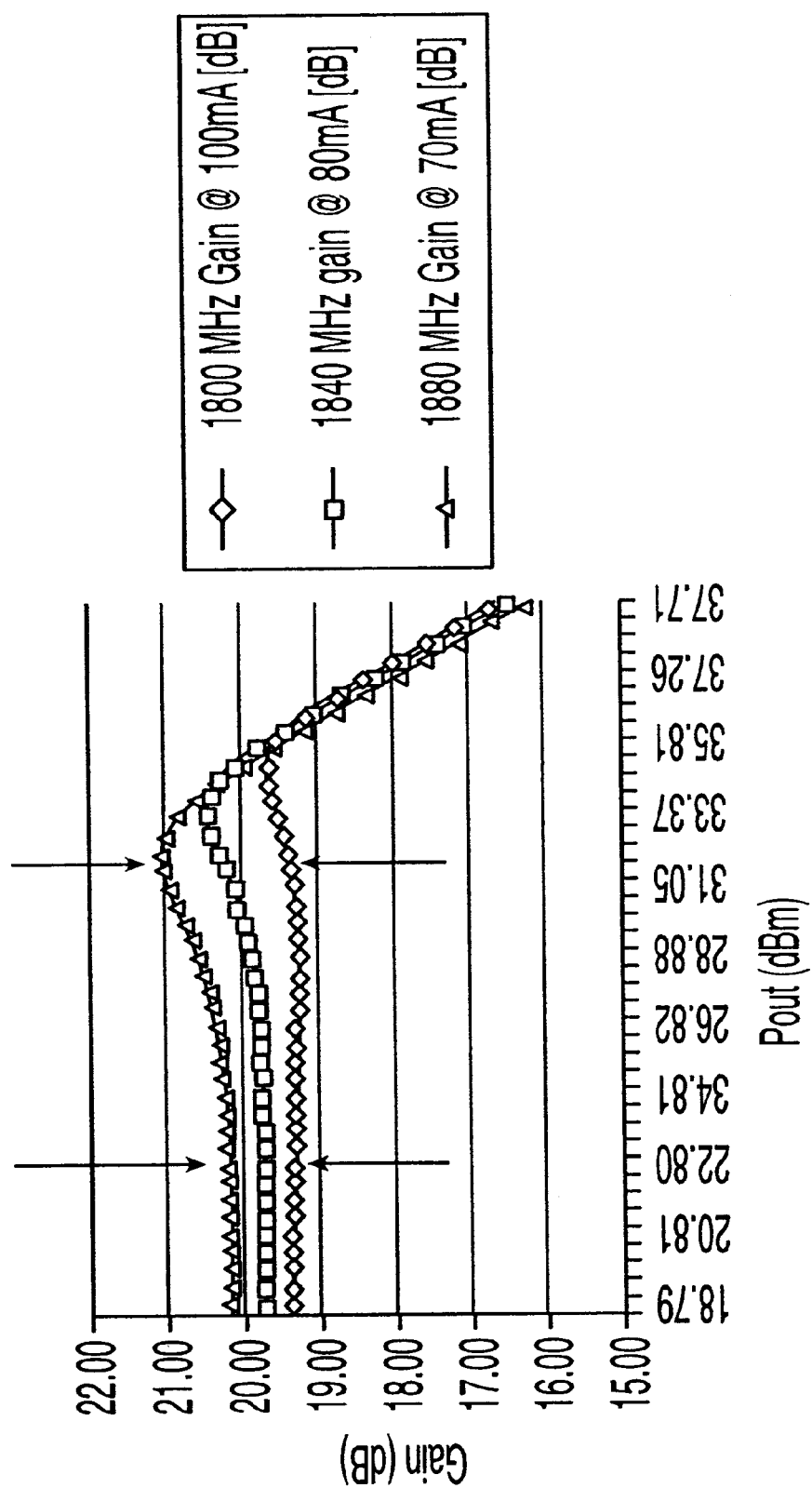
FIG. 6 is a graph that plots representative data collected about the amplifier of the present invention according to the process of FIG. 2.

By increasing the quiescent current at higher frequencies, the gain expansion and gain flatness exhibited in FIG. 13 can be minimized to that exhibited in FIG. 6 over the dynamic range of output powers and over the range of desired frequencies without changing the input or output matching network. This technique and circuitry permits. the design of large signal amplifiers that meet ever tighter system requirements. This technique and circuitry improves manufacturing yields for large signal amplifiers, and all other parameters being equal, permits the use of lower cost components with less tightly controlled tolerances yet still produces amplifiers that meet the system requirements.

Having described preferred embodiments of a novel large signal amplifier with gain compensation circuit (which are intended to be illustrative and not limiting), it is noted that modifications and variations can be made by persons skilled in the art in light of the above teachings. For example, the bias network comprising compensation circuit 30 and bias circuit 40 may be integrated in one analog or digital circuit. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by Letters Patent is set forth in the appended claims:

What is claimed is:

1. A power amplifier to process an input signal, the power amplifier comprising:
   an amplifying device operating at a quiescent point;
   a compensation circuit to provide a bias signal that varies according to a frequency of the input signal;
   a bias circuit to vary the quiescent point according to the bias signal, the quiescent point varied to compensate for a gain expansion and a gain flatness; and
   an input matching network coupled between the bias circuit and the amplifying device, the gain expansion is dependent on the frequency of the input signal and gain flatness is dependent on selection of the input matching network and the frequency of the input signal.

2. The power amplifier of claim 1, wherein the compensation circuit includes:
   a frequency discrimination circuit to provide a frequency dependent voltage; and
   an approximating network to provide the bias signal based on the frequency dependent voltage so that the quiescent point approximates a desired quiescent point corresponding to the frequency of the input signal.

3. The power amplifier of claim 1, wherein the compensation circuit includes:
   a look up table to provide a bias number responsive to a number that corresponds to the frequency of the input signal; and
   a converter to provide the bias signal responsive to the bias number.

4. The power amplifier of claim 1, wherein the quiescent point of the amplifying device is defined by a quiescent current passing through the amplifying device.

5. The power amplifier of claim 1, wherein the amplifying device is a device that processes the input signal at a frequency in a range between 1,800 MHz and 1,880 MHz.

6. A method of making the power amplifier of claim 1 comprising steps of:

measuring a gain performance of the amplifying device at a plurality of frequencies;

determining a desired quiescent point of the amplifying device at each frequency of the plurality of frequencies; and constructing the bias network so that an operating quiescent point of the amplifying device varies according to a frequency of the input signal, the operating quiescent point approximating the desired quiescent point at each frequency of the plurality of frequencies.

7. The method of claim 6, wherein the step of determining determines the desired quiescent point to be an operating quiescent point at which the amplifying device dissipates a minimum power that is consistent with providing a gain performance within a specified range of gains.

8. The method of claim 6, wherein the step of measuring includes steps of:

recording a measured gain of an amplifying device operated at a selected output power level, at a selected frequency and at a quiescent point;

a first step of repeating the step of recording at each output power level selected from a plurality of output power levels;

a second step of repeating the first step of repeating at each frequency selected from a plurality of frequencies; and a third step of repeating the second step of repeating at each quiescent point selected from a plurality of quiescent points.

9. A method of making a power amplifier, the power amplifier having a matching network circuitry, comprising steps of:

measuring a gain performance of an amplifying device at a plurality of frequencies;

determining a desired quiescent point of the amplifying device at each frequency of the plurality of frequencies; and constructing a bias network that varies an operating quiescent point of the amplifying device according to a frequency of the input signal so that the operating quiescent point approximates the desired quiescent point at each frequency of the plurality of frequencies, the operating quiescent point varied to compensate for a gain expansion and a gain flatness, the gain expansion and flatness dependent on frequency and selection of the matching network circuitry.

10. The method of claim 9, wherein the step of determining determines the desired quiescent point to be an operating quiescent point at which the amplifying device dissipates a minimum power that is consistent with providing a gain performance within a specified range of gains.

11. The method of claim 9, wherein the step of measuring includes steps of:

recording a measured gain of an amplifying device operated at a selected output power level, at a selected frequency and at a quiescent point;

a first step of repeating the step of recording at each output power level selected from a plurality of output power levels;

a second step of repeating the first step of repeating at each frequency selected from a plurality of frequencies; and a third step of repeating the second step of repeating at each quiescent point selected from a plurality of quiescent points.

12. The method of claim 9, wherein the step of constructing includes:

constructing a compensation circuit to provide a bias signal that varies according to a frequency of the input signal; and constructing a bias circuit to vary the quiescent point according to the bias signal.

13. The method of claim 12, wherein the step of constructing a compensation circuit includes:

constructing a frequency discrimination circuit to provide a frequency dependent voltage; and constructing an approximating network to provide the bias signal based on the frequency dependent voltage so that the quiescent point approximates a desired quiescent point corresponding to the frequency of the input signal.

14. The method of claim 12, wherein the step of constructing a compensation circuit includes:

constructing a look up table to provide a bias number responsive to a number that corresponds to the frequency of the input signal; and constructing a converter to provide the bias signal responsive to the bias number.

\* \* \* \* \*